US006877702B1

(12) United States Patent
Diggle et al.

(10) Patent No.: US 6,877,702 B1
(45) Date of Patent: Apr. 12, 2005

(54) ARTICULATED ARM WITH TOOL AND TEST SET PLATFORM PLUS BRACKET (ARTPET)

(75) Inventors: Frederick James Diggle, Birmingham, AL (US); Paul Brent Rivers, Cullman, AL (US)

(73) Assignee: BellSouth Intellectual Property Corporation, Wilmington, DE (US)

( * ) Notice: Subject to any disclaimer, the term of this patent is extended or adjusted under 35 U.S.C. 154(b) by 94 days.

(21) Appl. No.: 10/285,075

(22) Filed: Oct. 31, 2002

(51) Int. Cl.[7] .............................................. E04G 3/00
(52) U.S. Cl. ................ 248/278.1; 211/88.01; 248/205.1; 312/245; 312/351.9
(58) Field of Search .................... 248/274.1, 278.1, 248/276.1, 280.11, 917, 118.5, 205.1; 312/321.5, 312/405.1, 209, 245, 281, 351.9; 211/86.01, 211/88.01

(56) References Cited

U.S. PATENT DOCUMENTS

| 4,489,837 | A |   | 12/1984 | Adair |           |
|-----------|---|---|---------|-------|-----------|
| 4,607,897 | A | * | 8/1986  | Schwartz | 312/209 |
| 4,934,758 | A |   | 6/1990  | Walters |         |
| 5,100,091 | A | * | 3/1992  | Pollak | 248/278.1 |
| 5,221,132 | A | * | 6/1993  | Combs et al. | 312/310 |
| 5,429,336 | A | * | 7/1995  | Ko | 248/278.1 |
| 5,664,717 | A |   | 9/1997  | Joder |         |
| 5,931,102 | A | * | 8/1999  | Grahl | 108/42  |
| 5,971,512 | A | * | 10/1999 | Swan | 312/281 |
| 6,113,202 | A | * | 9/2000  | Germano | 312/245 |
| 6,138,970 | A | * | 10/2000 | Sohrt et al. | 248/278.1 |
| 6,260,752 | B1 |  | 7/2001  | Dollesin |       |
| 6,405,985 | B1 |  | 6/2002  | Glebe |          |
| 6,478,272 | B1 | * | 11/2002 | McKinsey et al. | 248/216.1 |
| 6,578,938 | B1 | * | 6/2003  | Norman et al. | 312/290 |

FOREIGN PATENT DOCUMENTS

WO    WO 98/55271    * 12/1998

OTHER PUBLICATIONS

Universal Series Cross-Connect Cabinets, ©2000, www.marconi.com/asp, Marconi Communications Inc., 4350 Weaver Parkway, Warrenville, IL 60555, date 2000.

* cited by examiner

Primary Examiner—Leslie A. Braun
Assistant Examiner—Tan Le
(74) Attorney, Agent, or Firm—Walters & Zimmerman; Bambi Faivre Walters

(57) ABSTRACT

Apparatus and methods provide a tool support assembly that is capable of being attached to a telecommunications or an electrical cabinet (e.g., mounted to an inside door or an inside wall). This invention provides for a telecommunications cabinet having the means to hold or otherwise support a variety of tools including flashlights, umbrellas, test sets, screwdrivers, wrenches, and other hand tools, and thereby increases access to the hardware and equipment housed within the cabinet, increases the environmental protection of the cabinet and of the hardware and equipment contained within the cabinet, and increases access to the surrounding work area.

19 Claims, 10 Drawing Sheets

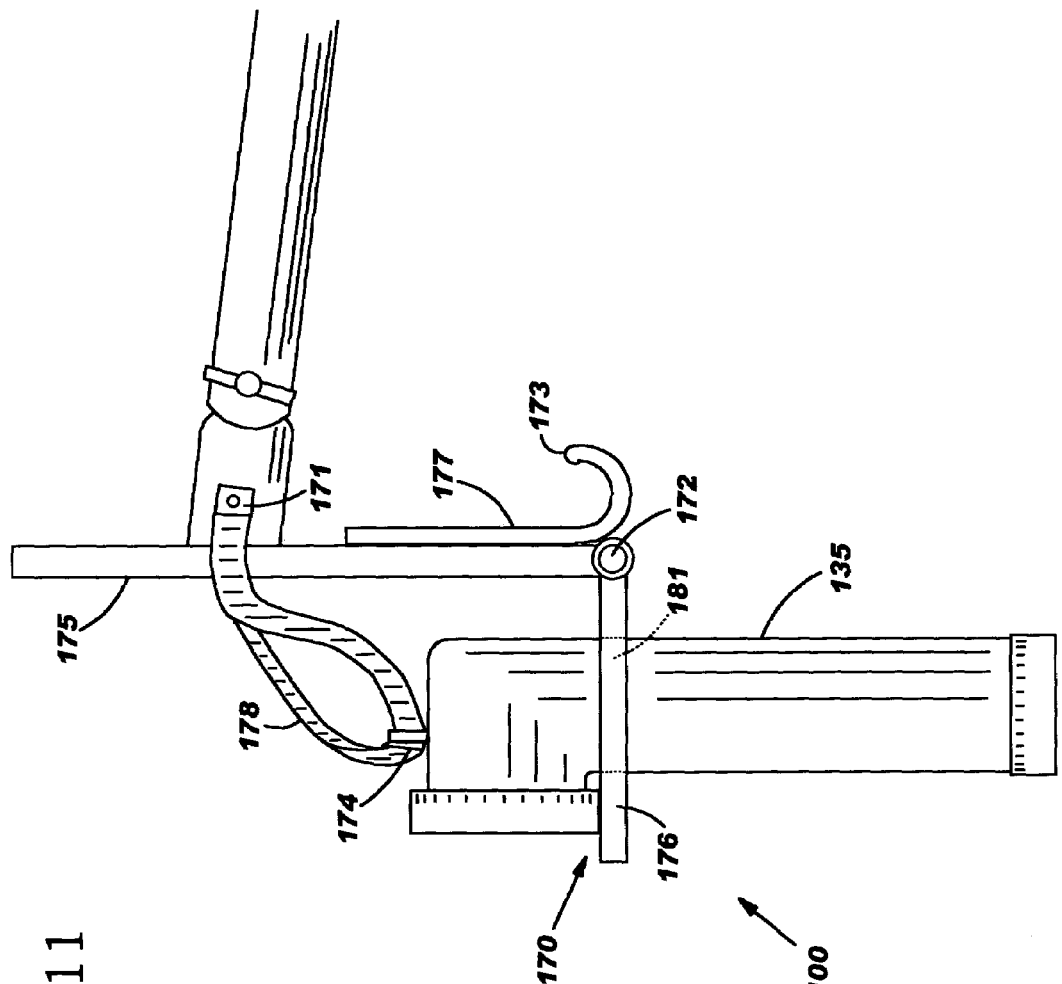

ARTICULATED ARM WITH TOOL AND TEST SET PLATFORM PLUS BRACKET (ARTPET)

A portion of the disclosure of this patent document and its figures contain material subject to copyright protection. The copyright owner has no objection to the facsimile reproduction by anyone of the patent document or the patent disclosure, but otherwise reserves all copyrights whatsoever.

BACKGROUND OF THE INVENTION

1. Field of the Invention

This invention relates generally to the field of telecommunications, and, in particular, to a tool support assembly for telecommunication cabinets.

2. Description of the Related Art

In the telecommunications or electronics industry, it is common practice to locate free-standing hardware and equipment outdoors. Typically, this hardware and equipment includes a surrounding cabinet to protect from ambient weather and other environmental conditions. As used herein, the term "cabinet" includes terminals, closures, enclosures, housings, and other devices used to protect outdoor telecommunications and/or electrical hardware and equipment. Cabinets may be polygon or non-polygonally shaped and constructed of any appropriate material, such as, for example, metal, polymer, plastic, ceramic, glass, crystal, and/or combinations thereof.

Technicians service this hardware and equipment when there are problems, upgrades, testing, maintenance, and other service requirements. Typically, the technicians bring a variety of tools such as umbrellas, test sets, flashlights, screwdrivers, and other objects, to work on the hardware and equipment. Because the technician does not have a great deal of room to work and frequently must use one hand to assist in securing the tools, it is difficult for the technician to gain optimal access to the hardware and equipment. For example, the technician is often required to use one hand to aim a flashlight inside the cabinet while the equipment is being inspected or serviced. The technician may also use one hand to hold and/or angle test sets to acquire measurement readings. Another example is during adverse weather conditions, when the technician uses one hand to hold or otherwise support an umbrella over the hardware and equipment. Thus, the technician frequently uses one or more hands to maneuver the tools making it difficult, tiring and time-consuming to optimally service the hardware and equipment.

SUMMARY OF THE INVENTION

This invention addresses the above-described and other needs by providing an tool support assembly that is capable of being attached to a telecommunications or an electrical cabinet (e.g., mounted to an inside door or an inside wall). This invention provides for a telecommunications cabinet having the means to hold or otherwise support a variety of tools including flashlights, umbrellas, test sets, screwdrivers, wrenches, and other hand tools, and thereby increases access to the hardware and equipment housed within the cabinet, increases the environmental protection of the cabinet and of the hardware and equipment contained within the cabinet, and increases access to the surrounding work area. Further, the tool support assembly includes means to securely position an arm and/or a tray of the assembly with the supported tools.

In an embodiment, the support tray assembly includes a support bracket having a bracket base portion, means for mounting the bracket base portion to a telecommunications cabinet, and an elongated support arm having first and second ends. The first end is movably attached to the support bracket and the second end is movably attached to a support tray that is configured to hold or otherwise support a variety of tools. The assembly includes means for positioning the first end of the support arm relative to the support bracket and means for positioning the equipment support tray relative to the second end of the support arm, such as, for example, a nut and bolt assembly that can be tightened about a mated portion of the support tray and a mated portion of the support arm. In another embodiment, the elongated support arm is an articulated (e.g., jointed) arm having pivotally attached arm members that allow a variety of positions for the tool support tray and that allow adjustment of the support tray assembly to accommodate equipment of varying dimensions (e.g., heights, widths, lengths, shapes, etc.). The arm members may include means for securing the support arm in a fixed position, such as, for example a nut and bolt assembly that can be tightened about a mated portion of the arm members and thereby retain the arm members in the fixed position. In another embodiment, the base wall has at least one passageway capable of holding or otherwise supporting a tool and may also include a tool locking mechanism to secure the tool in the passageway. In still another embodiment, the tool support assembly may include at least one hook attached to a back portion of the bottom of the side wall opposite the base wall.

This invention further includes the telecommunications cabinet having a plurality of side walls, a top, and at least one door providing access to an interior of the cabinet, and the tool support assembly described in the above and other embodiments. The interior of the cabinet houses hardware and equipment for sending and receiving telecommunications signals. Finally, this invention includes a method of supporting at least one tool that includes positioning the tool onto the tool support assembly described in the above and other embodiments.

BRIEF DESCRIPTION OF THE DRAWINGS

The above and other embodiments, objects, uses, advantages, and novel features of this invention are more clearly understood by reference to the following description taken in connection with the accompanying figures, in which:

FIG. 11 illustrates the tool support assembly of FIG. 1 supporting or otherwise positioning a flashlight according to an embodiment of this invention.

DETAILED DESCRIPTION OF THE INVENTION

This invention now will be described more fully hereinafter with reference to the accompanying drawings, in which exemplary embodiments are shown. This invention may, however, be embodied in many different forms and should not be construed as limited to the embodiments set forth herein; rather, these embodiments are provided so that this disclosure will be thorough and complete, and will fully convey the scope of the invention to those of ordinary skill in the art. Moreover, all statements herein reciting embodiments of the invention, as well as specific examples thereof, are intended to encompass both structural and functional equivalents thereof. Additionally, it is intended that such equivalents include both currently known equivalents as well as equivalents developed in the future (i.e., any elements developed that perform the same function, regardless of structure). Thus, for example, it will be appreciated by those skilled in the art that the schematics and the like represent conceptual views of illustrative structures embodying this invention.

In the claims hereof any element expressed as a means for performing a specified function is intended to encompass any way of performing that function including, for example, a combination of elements that performs that function. The invention as defined by such claims resides in the fact that the functionalities provided by the various recited means are combined and brought together in the manner that the claims call for. Applicant thus regards any means that can provide those functionalities as equivalent as those shown herein.

This invention is directed to a tool support assembly that is capable of being attached to a telecommunications or an electrical cabinet (e.g., mounted to an inside door or an inside wall). This invention provides for a telecommunications cabinet having the means to hold or otherwise support a variety of tools including flashlights, umbrellas, test sets, screwdrivers and other hand tools, and thereby increases access to the hardware and equipment housed within the cabinet, increases the environmental protection of the cabinet and of the hardware and equipment contained within the cabinet, and increases access to the surrounding work area. Further, the tool support assembly includes means to securely position an arm and/or a tray of the assembly with the supported tools. Further, this invention includes the resulting cabinet (i.e., the cabinet with the tool support assembly attached) and a method of positioning or otherwise supporting a tool with the tool support assembly.

Figure 1:
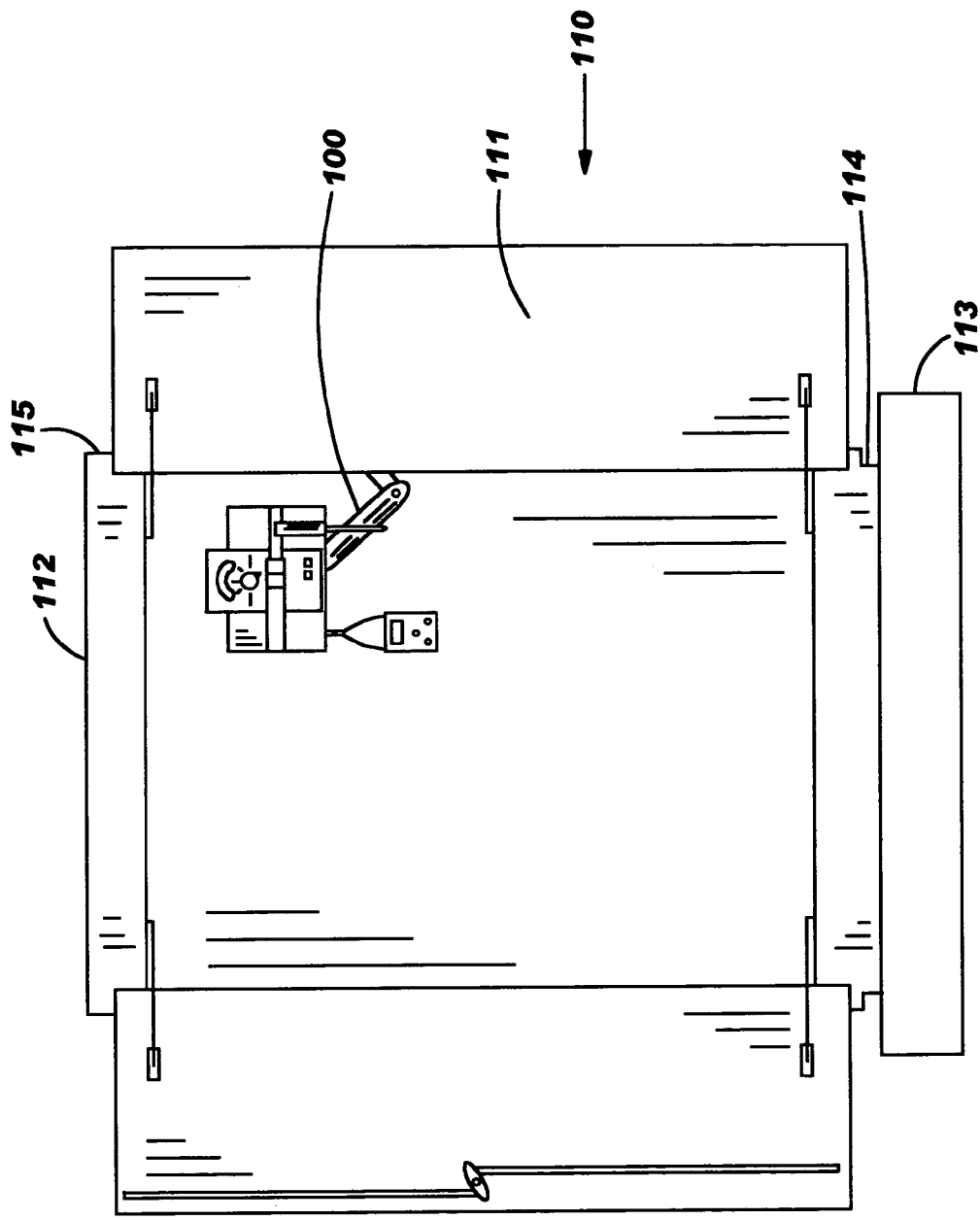
FIG. 1 is a perspective front view of an opened telecommunications cabinet having a tool support assembly attached to an interior side wall of a telecommunications cabinet according to an embodiment of this invention.
Figure 2:
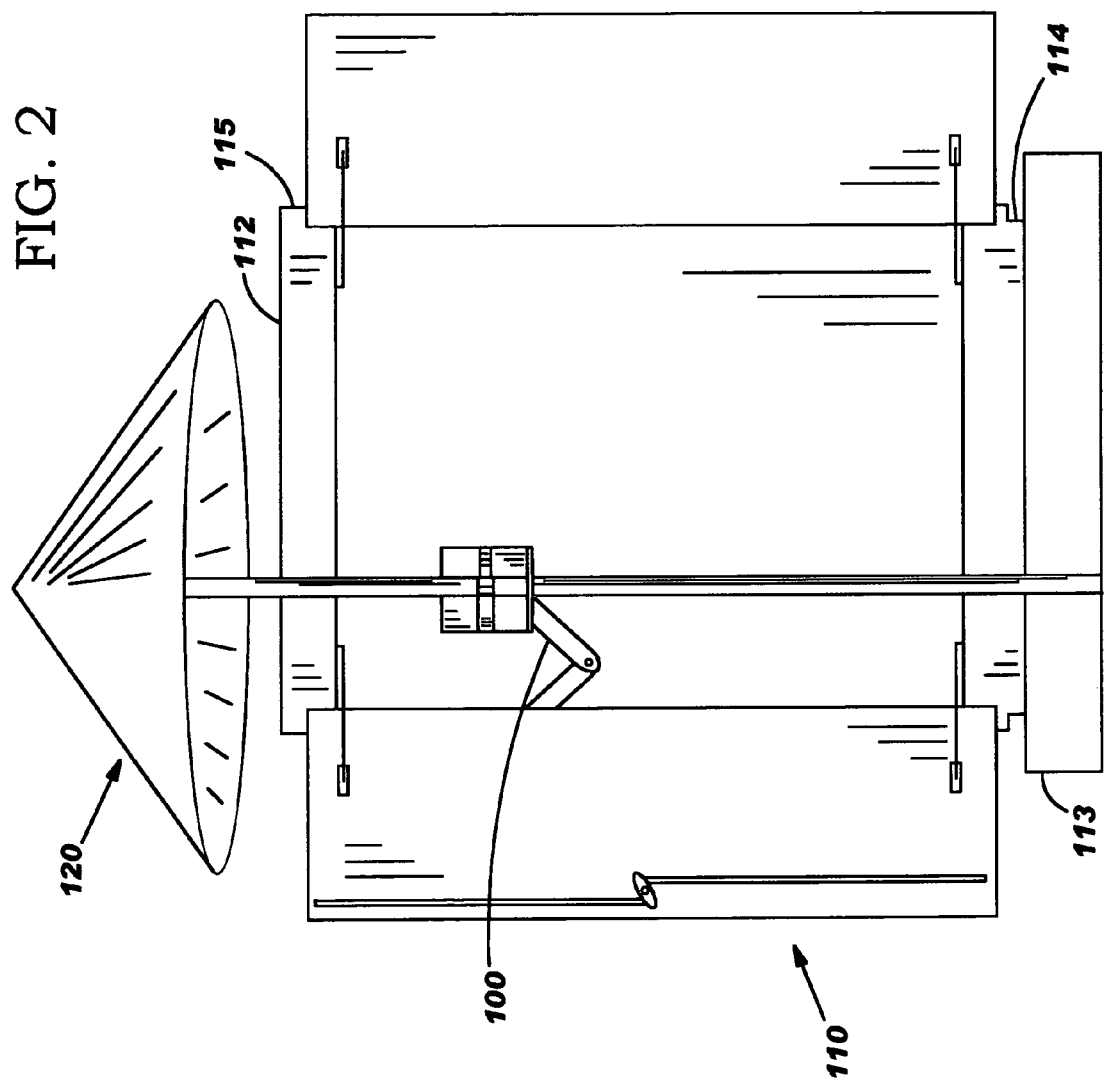
FIG. 2 illustrates the tool support assembly of FIG. 1 supporting or otherwise positioning an umbrella according to an embodiment of this invention.
Figure 3:
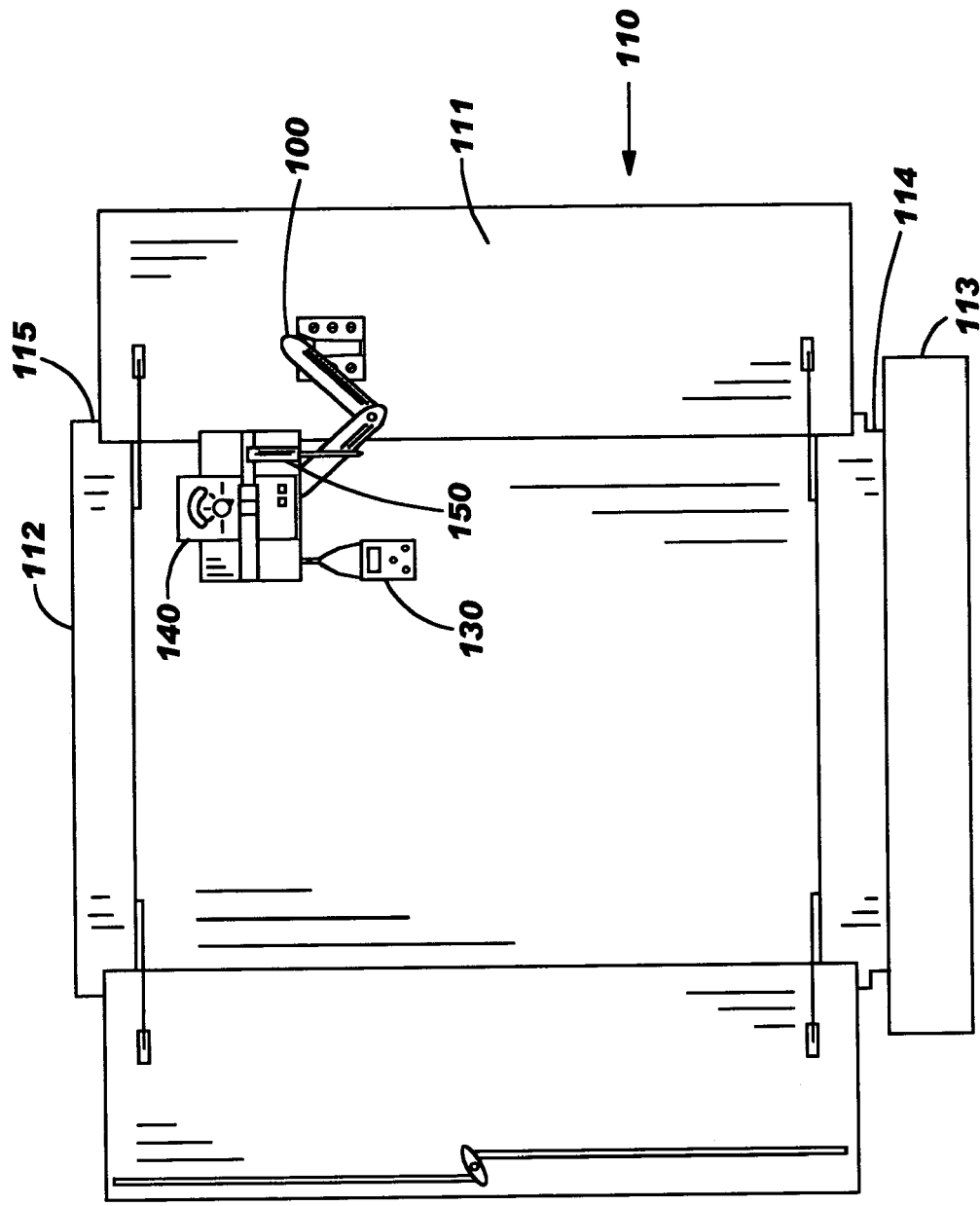
FIG. 3 is a perspective front view of an opened telecommunications cabinet having the tool support assembly of FIG. 1 attached to an interior door of a telecommunications cabinet according to an embodiment of this invention.

As shown in FIGS. 1–3, the design of a tool support assembly 100 is based on a conventional design of a telecommunications cabinet 110. For example, the Universal Series Cross-Connect Cabinet manufactured by Marconi Communications (Marconi Communications, 4350 Weaver Parkway, Warrenville, Ill. 60555, 630-579-5000, www.marconi.com) is one example of an existing telecommunications cabinet that may use the tool support assembly 100. While a conventional cabinet design is shown, a variety of cabinets can easily use the tool support assembly 100.

As shown by FIGS. 1–4, a free-standing item of telecommunications hardware and equipment comprises the cabinet 110 secured to a concrete pad 113. As depicted, the cabinet 110 has a rectangular or square-shape; however, as one of ordinary skill in the art appreciates, the cabinet 110 may take on a variety of shapes. The tool support assembly 100 may be manufactured using any appropriate material that can withstand a wide range of temperatures, humidity, moisture, and other environmental conditions. For example, the tool support assembly 100 can be formed of G90 galvanized steel having a durable finish coating, such as polyurethane powder. Alternatively, the tool support assembly 100 could be constructed of other appropriate metal, polymer, plastic, ceramic, glass, crystal, and combinations thereof. If the tool support assembly 100 is made from a conductive material, an existing ground (not shown) of the cabinet 110 may be used to ground the tool support assembly 100.

The cabinet 110 is provided with at least one access door 111 at its front, a top 112, a bottom portion 114, a pair of side walls 115, and a back wall (not shown). For maintenance and other service purposes, the tool support assembly 100 is provided for positioning or otherwise supporting a tool (e.g., umbrella 120 shown in FIG. 2 or test set 130, test set 140, or screwdriver 150 shown in FIG. 3) in a working position immediately in front of or near the opened door 111. Thus, the tool support assembly 100 allows a technician to have hands-free access to the hardware and equipment when the door 111 is open. The prior art required the technicians themselves to position and otherwise support the tools, thus making it difficult, tiring, and time-consuming to optimally service the hardware and equipment.

Figure 4:
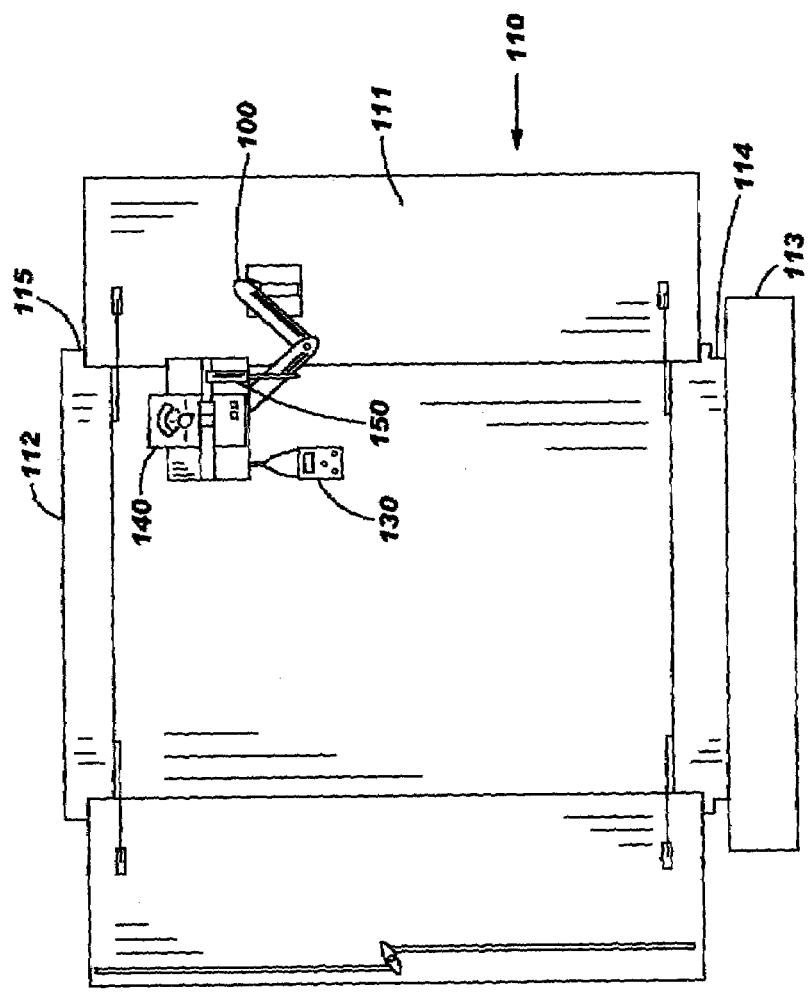
FIG. 4 illustrates the tool support assembly of FIG. 3 with alternate attachment means according to an embodiment of this invention.

As shown in FIGS. 1 and 2, the tool support assembly 100 may be secured to an interior wall, such as the side wall 115, of the cabinet 110. Alternatively, the tool support assembly 100 may be secured to a door 111 of the cabinet. As one of ordinary skill in the art appreciates, the tool support assembly 100 may be secured to a variety of locations within or onto the cabinet. Further, the tool support assembly 100 may be secured using a variety of means, such as by fastening bolts 161 into holes (not shown) of the door, 111 as shown in FIG. 3 or by welding as shown in FIG. 4. As one of ordinary skill in the art also appreciates the means of attaching the tool support assembly 100 to the cabinet 110 may include a variety of well know elements in the art including screws, nuts, bolts, rivets, clamps, adhesive, magnets, welding, and the like.

Figure 5:
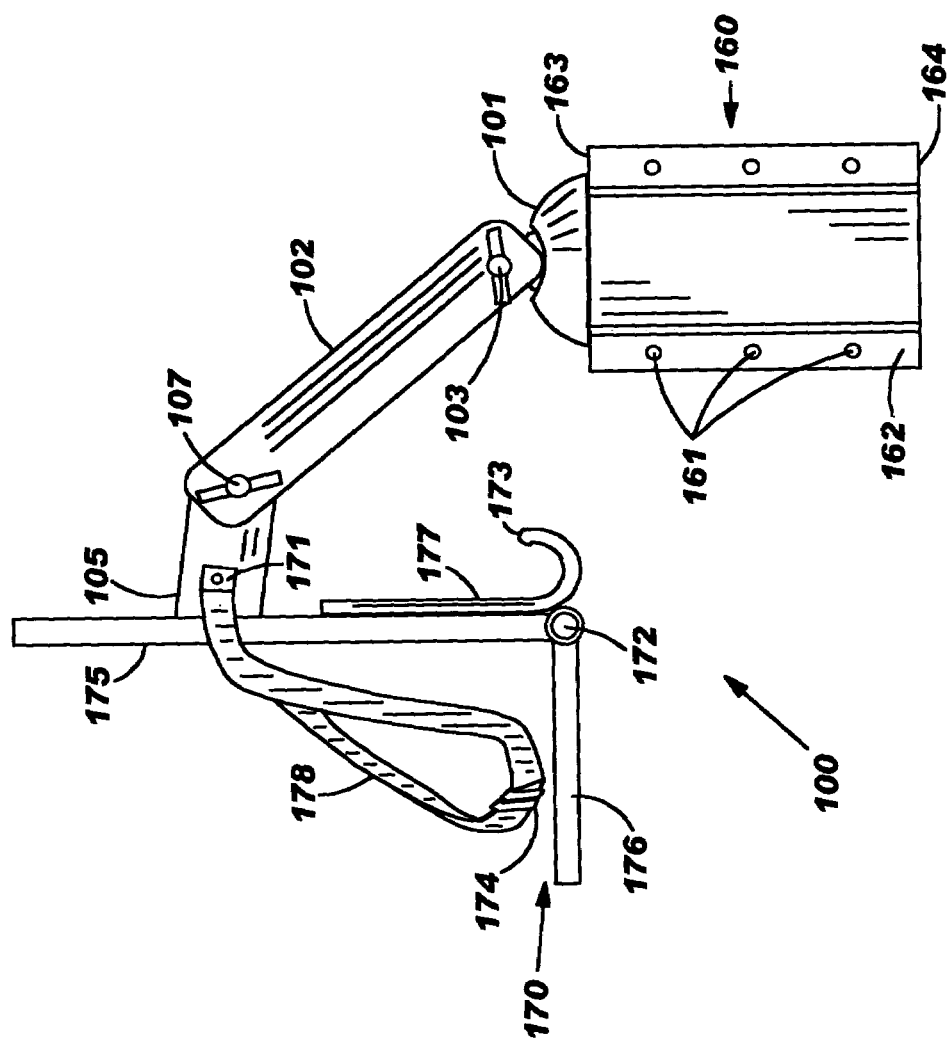
FIG. 5 is a perspective side view of a tool support assembly having non-articulated arm according to an embodiment of this invention.
Figure 6:
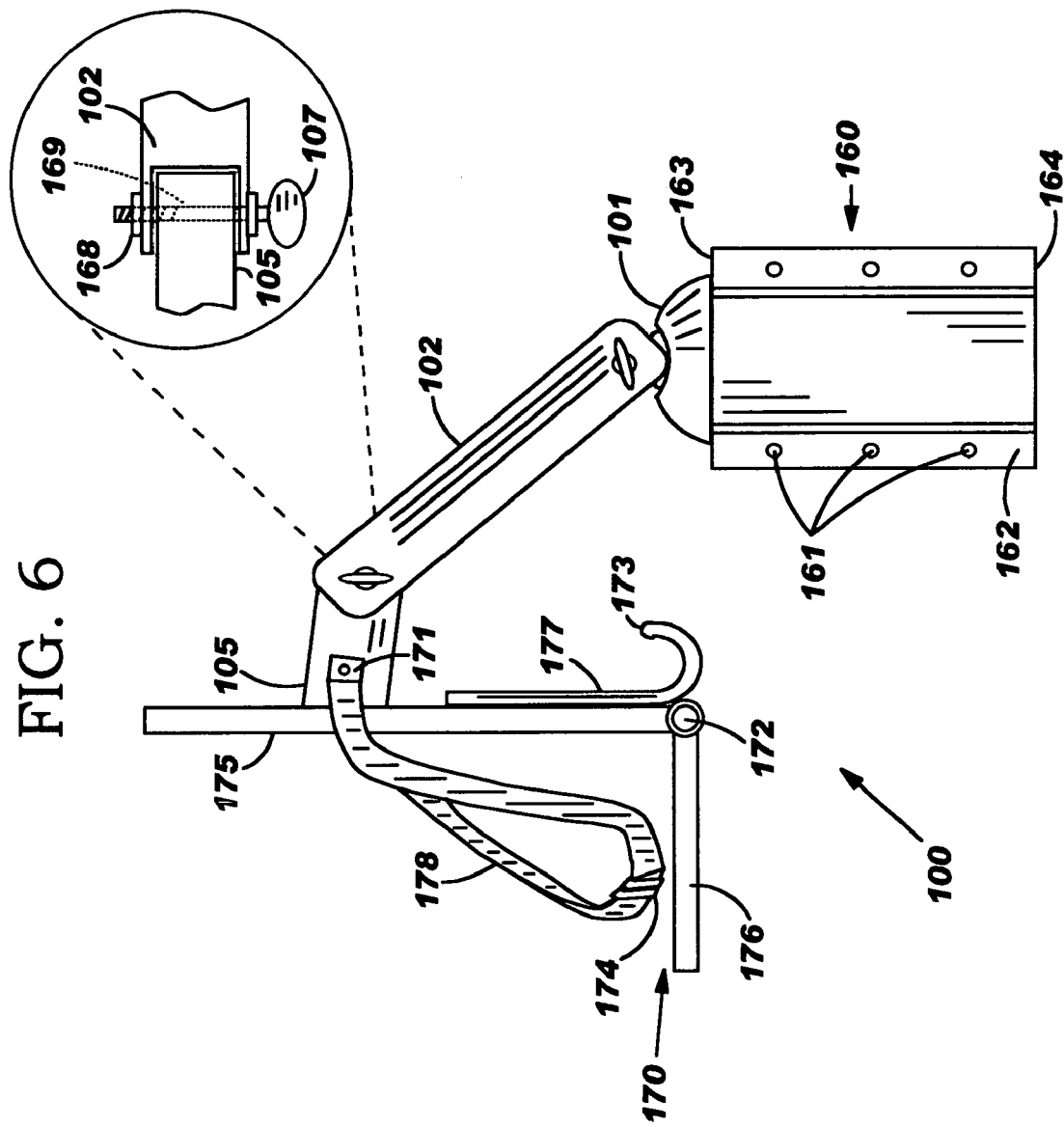
FIG. 6 is a perspective side view of the tool support assembly of FIG. 5 having a nut and bolt assembly to secure a tool in a passageway of the tool support tray according to an embodiment of this invention.

Referring now to FIG. 5, the tool support assembly 100 includes a support bracket 160, means for mounting the bracket base portion 162 to the telecommunications cabinet 110 (shown as bolts 161), an elongated support arm 102, means for positioning 103 the support arm 102 relative to the support bracket 160, an equipment support tray 170, and means for positioning the equipment support tray 170 relative to the support arm 102. The support bracket includes a bracket base portion 162, a top 163, and a bottom 164 and is movably attached 101 to an end of the elongated support arm 102. The support tray 170 includes an upwardly extending side wall 175 defining a longitudinal axis with a top (not numbered) and a bottom (not numbered) and a base wall 176 extending horizontally from a front portion of the bottom of the side wall 175. The elongated support arm 102 pivots or otherwise swivels and is capable of adjusting the position of the support tray 170 in a cantilever fashion relative to the support bracket 160. Further, the support tray 170 is attached 105 to the other end of the elongated support arm 102. In an embodiment, the means of positioning the equipment support tray 170 relative to the support arm 102 may include a clamping assembly comprising a bolt 107 and a nut 168 sized to interengage matching aligned holes 169 of the support arm 102 and support tray 170, and thereby, the bolt 107 and nut may be tightly fastened to securely clamp the support arm 102 and with portion 105 of the support tray 170 therebetween.

Figure 7:
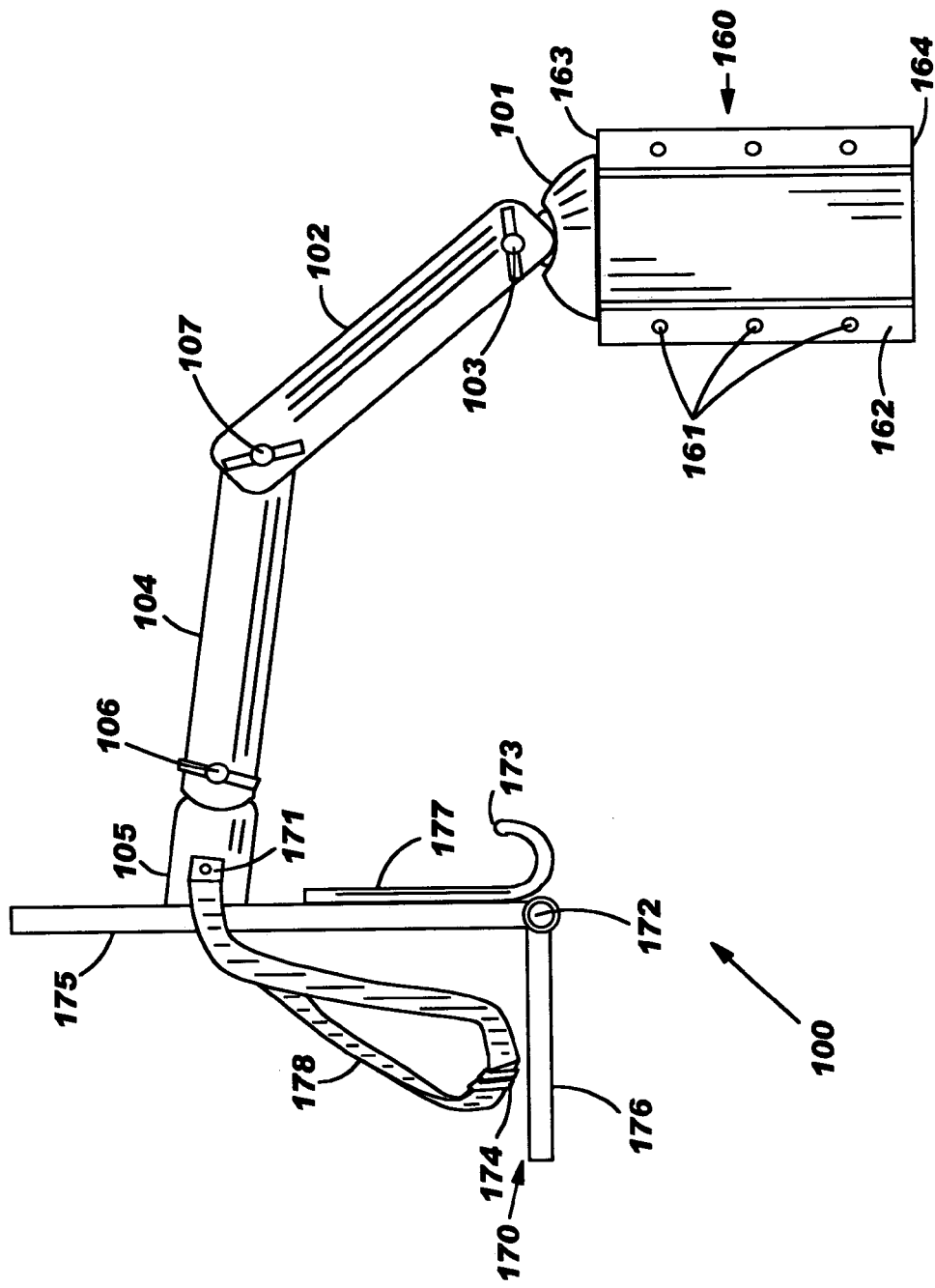
FIG. 7 is a perspective side view of the tool support assembly of FIG. 1.

FIG. 7 illustrates another embodiment of this invention wherein the elongated support arm 102 of the tool support assembly 100 includes an articulated or otherwise jointed arm of pivotally attached arm members 102, 104. The arm members 102, 104 may include means 107 for securing the arm members 102, 104 in a working position that allow adjustment of the support tray assembly 100 to accommodate tools of varying dimensions (e.g., height, width, length, shapes, etc.). For example, FIG. 2 illustrates the arm members 102, 104 in a secured working position to hold or otherwise support an umbrella 120 that provides environmental protection of the hardware and equipment and surrounding work area.

Referring now to the support tray 170 depicted in FIGS. 6–10, the base wall 176 and the side wall 175 have the appearance of a generally "L"-shaped frame and include a hinge 172 for pivotally connecting the base wall 176 to the side wall 175. In an embodiment, the base wall 176 pivots about the hinge 172 through an arc of about 90 degrees. Although not shown, the support tray may also include a base wall storage lock that secures the base wall 176 in a near parallel position relative to the side wall 175 to minimize storage space when the tool support assembly 100 is not in use.

Figure 8:
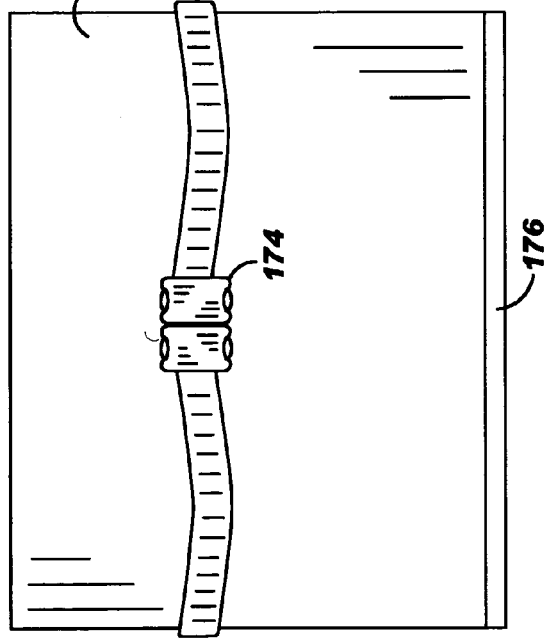
FIG. 8 is a perspective front view of the support tray assembly of FIG. 1 showing additional details according to an embodiment of this invention.
Figure 9:
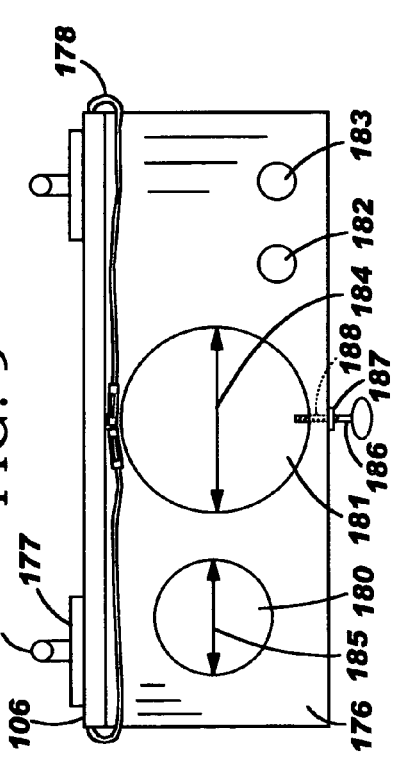
FIG. 9 is a perspective top view of the support tray assembly of FIG. 1 showing additional details according to an embodiment of this invention.

As FIG. 8 shows, the base wall 176 of the tool support assembly 100 may further include at least one passageway 180, 181, 182, 184 for receiving and/or otherwise positioning one or more tools. The passageway 180, for example, may receive an umbrella 120 as illustrated in FIG. 2. The passageway 180 defines an aperture for receiving a first end of a generally cylindrical section of an umbrella pole. In addition, the tool support assembly 100 may include means for locking the tool in a working position, such as the umbrella pole, within the passageway 180. As depicted in FIG. 9, the locking means is a thumbscrew assembly that includes a thumbscrew 186, a nut 187, and a threaded passageway 188. The thumbscrew 186 includes a threaded shaft to retain the umbrella pole. As one of ordinary skill in the art appreciates, alternative locking means such as, for example, a friction spring, a wedge, a locking pin assembly, other frictional securing means, and adhesives could be used to secure the tool within the passageway 180, 181, 182, 184.

Figure 10:
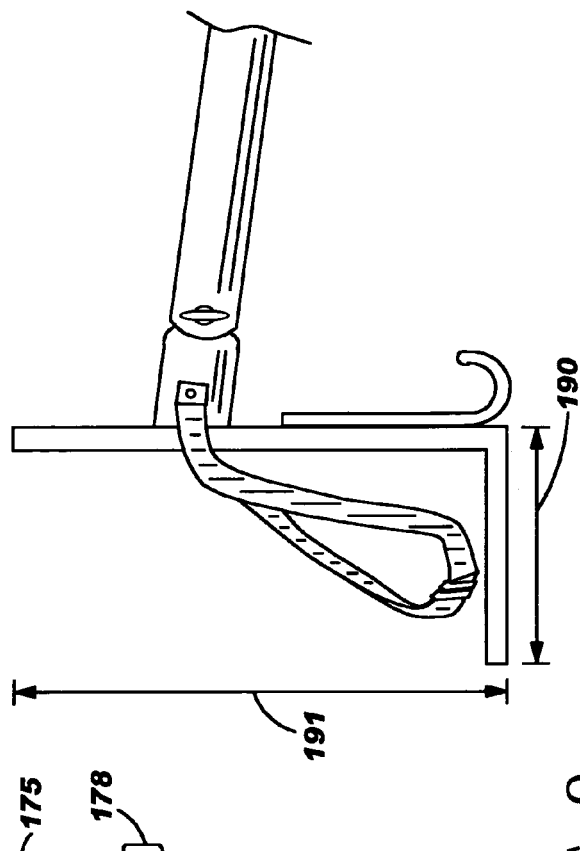
FIG. 10 is a perspective side view of the support tray assembly of FIG. 1 showing additional details according to an embodiment of this invention.
Figure 12:
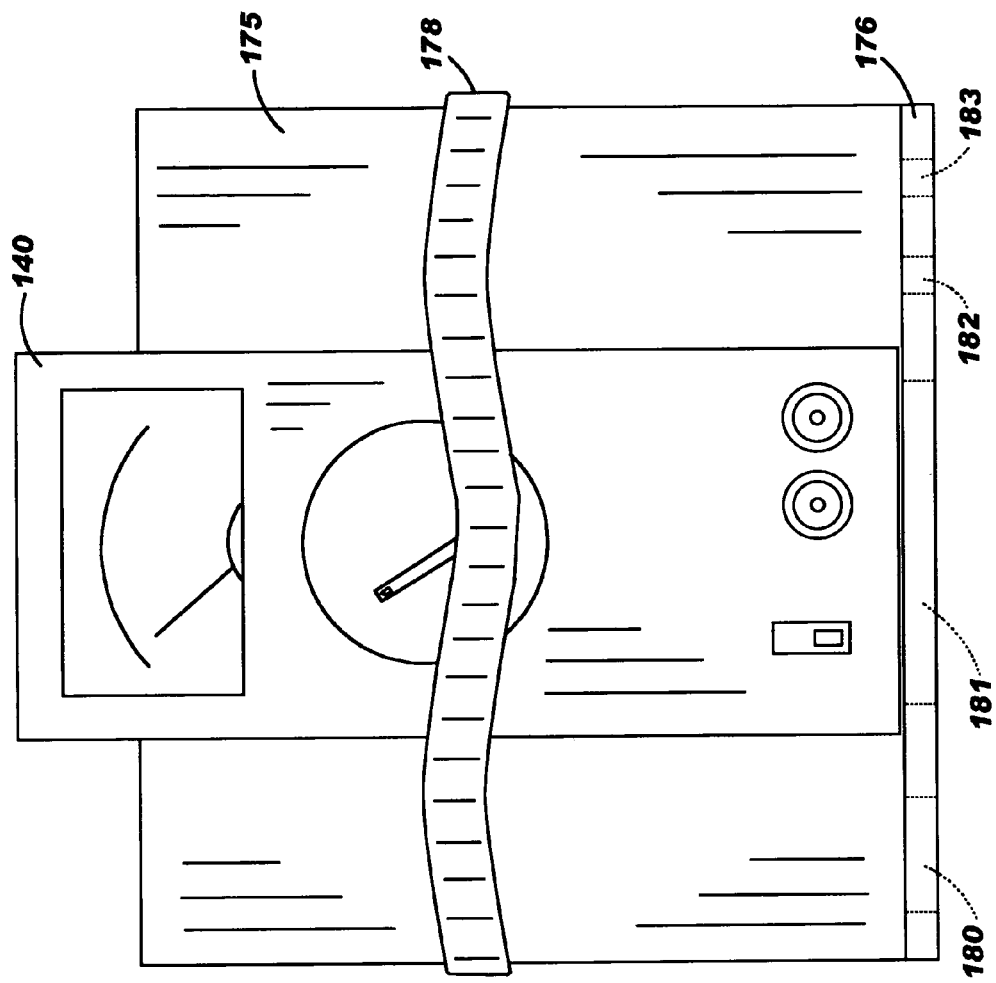
FIG. 12 illustrates the tool support assembly of FIG. 1 supporting or otherwise positioning a test set according to an embodiment of this invention.

The tool support assembly 100 may further include other elements that help support or otherwise hold a tool. For example, as shown in FIGS. 7 and 10, the tool support assembly 100 includes at least one hook 173 attached to a back portion of the bottom of the side wall 175 opposite the base wall. The hook has the appearance of a generally backwards "J"-shaped frame and may be used to suspend tools, such as a test set 130 shown in FIG. 3 and/or other objects including coats, hats, and other personal articles of the technician. Another example includes a pair of tool support straps 178 that have a buckle or other snap fit connection 174 and that extend about an upper portion of the side wall 175 as shown in FIG. 8. The support straps 178 are useful to position a test meter (shown as reference numeral 140 in FIGS. 3 and 12). Alternatively, the support straps 178 may extend about other locations of the support tray 170 and have a variety of connection elements, including connection means that allow the support straps to adjust for differently shaped tools (e.g., a seatbelt-type connection that allows one of the support straps 178 to vary lengths) and that provide ease of use (e.g., the uniform support strap 178 shown in FIG. 12).

In a preferred embodiment, the width 190 of the support tray 176 is approximately four inches, the height 191 of the side wall 175 is approximately seven inches, the diameter 185 of passageway 180 is approximately one and a half (1½) inches, and the diameter 184 of passageway 181 is approximately three inches. Alternatively, as one of ordinary skill in the art appreciates, these measurements may vary so long as the tool support assembly 100 supports or otherwise holds a variety of tools, such as, for example, the umbrella 120 in a generally upright position when the umbrella pole is positioned in passageway 180 as shown in FIG. 2, a screwdriver 150 when a bladed portion of the screwdriver is positioned in passageway 183 to support or otherwise suspend a handled portion of the screwdriver 150 as shown in FIG. 3, and a flashlight 135 when the flashlight 135 is positioned in passageway 181 as shown in FIG. 11.

In addition to the above embodiments, this invention includes the telecommunications cabinet having a plurality of side walls, a top, and at least one door providing access to an interior of the cabinet, and the tool support assembly 100 described in the above embodiments. The interior of the cabinet houses hardware and equipment for sending and receiving telecommunications signals or electrical hardware and equipment.

Finally, this invention includes a method of supporting or otherwise holding a tool that includes positioning the tool on or within the above-described tool support assembly of a telecommunications cabinet. For example, this invention includes supporting the umbrella 120 in a generally upright position when the umbrella pole is positioned in passageway 180 as shown in FIG. 2, supporting the handled portion of the screwdriver 150 when the bladed portion of the screwdriver 150 is positioned in passageway 183 as shown in FIG. 3, and supporting the flashlight 135 when the flashlight 135 is positioned in passageway 181 as shown in FIG. 11.

Many modifications and other embodiments of the invention will come to mind to one skilled in the art to which this invention pertains having the benefit of the teachings presented in the foregoing descriptions and the associated drawings. For example, the support tray 170 may take on alternate shapes, such that they may be curved, flexible, or otherwise designed to position, support, or otherwise hold a tool. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. A tool support assembly, comprising:
   a support bracket having a bracket base portion, a top, and a bottom;
   means for mounting the bracket base portion to a telecommunications cabinet; and
   an elongated support arm having first and second ends, the first end being movably attached to the support bracket the second end being movably attached to a tool support tray, the tool support tray having an upwardly extending side wall defining a longitudinal axis with a top and a bottom and a base wall extending horizontally from a front portion of the bottom of the side wall, the base wall having at least one passageway, the passageway defining an aperture for supporting a tool.

2. The tool support assembly of claim 1, further comprising:
   means for positioning the first end of support arm relative to the support bracket.

3. The tool support assembly of claim 1, further comprising:
   means for positioning the tool support tray relative to the second end of the support arm.

4. The tool support assembly of claim 1, wherein the elongated support arm comprises an articulated arm having pivotally attached arm members.

5. The tool support assembly of claim 4, further comprising:
   means for securing the support arm in a working position to allow adjustment of the support tray assembly to accommodate tools of varying dimensions.

6. The tool support assembly of claim 1, wherein the bracket base portion is mounted to a door of the telecommunications cabinet.

7. The tool support assembly of claim 1, wherein the bracket base portion is mounted to a wall of the telecommunications cabinet.

8. The tool support assembly of claim 1, further comprising:
   a locking mechanism, the locking mechanism capable of securing the tool in a desired position within the passageway.

9. The tool support assembly of claim 8, wherein the locking mechanism comprises a thumbscrew.

10. The tool support assembly of claim 1, further comprising at least one hook attached to a back portion of the bottom of the side wall opposite the base wall.

11. The tool support assembly of claim 1, further comprising a pair of tool support straps extending about a portion of the support tray.

12. The tool support assembly of claim 11, wherein the tool support straps extend about an upper portion of the side wall of the support tray.

13. The tool support assembly of claim 1, wherein the first end of the support arm is movable in a cantilever manner relative to the bracket base portion.

14. The tool support assembly of claim 1, wherein means for mounting the bracket base portion to the telecommunications cabinet comprises at least one of the following:
   a nut;
   a bolt;
   a screw;
   a rivet; and
   welding.

15. The tool support assembly of claim 1, wherein the means for positioning the second end of the support arm relative to the support tray comprises a clamping assembly comprising a bolt and a nut sized to interengage matching holes of the support arm and of a mating end of the support tray and securely clamp the second end and the mating end therebetween.

16. A tool support assembly, comprising:
   a support bracket having a bracket base portion, a top, and a bottom;
   means for mounting the bracket base portion to a telecommunications cabinet; and
   an elongated support arm having first and second ends, the first end being movably attached to the support bracket, the second end being movably attached to a support tray, the support tray having an upwardly extending side wall defining a longitudinal axis with a top and a bottom and a base wall extending horizontally from a front portion of the bottom of the side wall;
   means for positioning the first end of support arm relative to the support bracket;
   means for positioning the tool support tray relative to the second end of the support arm; and
   hinge means for pivotally connecting the base wall of the support tray to the upwardly extending side wall, the hinge means effective to pivot the base wall in a horizontal plane about a generally vertical pivot axis through an arc of about 90 degrees.

17. A telecommunications cabinet, comprising:
   a plurality of side walls, a top, and at least one door providing access to an interior of the cabinet, wherein the interior of the cabinet houses equipment for sending and receiving telecommunications signals; and
   a tool support assembly comprising:
      a support bracket having a bracket base portion, a top, and a bottom,
      means for mounting the bracket base portion to the telecommunications cabinet, and
      an elongated support arm having first and second ends, the first end being movably attached to the support bracket, the second end being movably attached to a support tray, the tool support tray, the tool support tray having an upwardly extending side wall defining a longitudinal axis with a top and a bottom and a base wall extending horizontally from a front portion of the bottom of the side wall, the base wall having at least one passageway, the passageway defining an aperture for supporting a tool.

18. A telecommunications cabinet, comprising:
   a plurality of side walls, a top, and at least one door providing access to an interior of the cabinet, wherein the interior of the cabinet houses equipment for sending and receiving telecommunications signals; and
   a tool support assembly comprising:
      a support bracket having a bracket base portion, a top, and a bottom,
      means for mounting the bracket base portion to the telecommunications cabinet,
      an elongated support arm having first and second ends, the first end being movably attached to the support bracket, the second end being movable attached to a support tray, the support tray having an upwardly extending sidewall defining a longitudinal axis with a top and a bottom and a base wall extending horizontally from a front portion of the bottom of the sidewall,
      means for positioning the first end of support arm relative to the support bracket, and
      means for positioning the tool support tray relative to the second end of the support arm.

19. A method of supporting a tool, comprising:

positioning the tool on a tool support assembly of a telecommunications cabinet, the tool support assembly comprising a support bracket having a bracket base portion, a top, and a bottom; means for mounting the bracket base portion to the telecommunications cabinet; and further comprising an elongated support arm having first and second ends, the first end being movably attached to the support bracket, the second end being movably attached to a tool support tray, the tool support tray having an upwardly extending side wall defining a longitudinal axis with a top and a bottom and a base wall extending horizontally from a front portion of the bottom of the side wall, the base wall having at least one passageway, the passageway defining an aperture for supporting a tool.

* * * * *